(12) United States Patent
Knighten et al.

(10) Patent No.: US 6,912,135 B1
(45) Date of Patent: Jun. 28, 2005

(54) PROVIDING SHIELDS FOR SYSTEMS

(75) Inventors: James L. Knighten, Poway, CA (US); Jun Fan, Escondido, CA (US)

(73) Assignee: NCR Corporation, Dayton, OH (US)

( * ) Notice: Subject to any disclaimer, the term of this patent is extended or adjusted under 35 U.S.C. 154(b) by 0 days.

(21) Appl. No.: 10/293,067

(22) Filed: Nov. 13, 2002

(51) Int. Cl.[7] ............................................. H05K 9/00
(52) U.S. Cl. ...................... 361/816; 361/800; 361/818; 174/35 R
(58) Field of Search ............................... 361/753, 799, 361/800, 816, 818; 174/35 R, 35 GC, 35 MS

(56) References Cited

U.S. PATENT DOCUMENTS

| | | | |
|---|---|---|---|
| 3,775,732 A | | 11/1973 | Frogner |
| 4,160,572 A | | 7/1979 | Adelberger et al. |
| 4,272,573 A | * | 6/1981 | Ewald et al. ............... 428/40.8 |
| 4,804,568 A | * | 2/1989 | Ohsawa et al. ............ 428/40.9 |
| 5,595,801 A | * | 1/1997 | Fahy et al. ................. 428/40.1 |
| 5,679,923 A | * | 10/1997 | Le ............................ 174/35 R |
| 5,932,848 | * | 8/1999 | Gordon .................. 177/210 R |
| 6,359,213 | * | 3/2002 | Long ........................ 174/35 R |
| 6,392,872 | * | 5/2002 | Doustou et al. ............ 361/681 |
| 6,723,914 | * | 4/2004 | Sato et al. ................. 174/35 R |

OTHER PUBLICATIONS

U.S. Appl. No. 09/881,464, filed Feb. 6, 2003, Knighten et al.
InfiniBand[SM] Trade Association, InfiniBand™ Architecture Release 1.0 vol. 2—Physical Specifications, "Copper Cable," pp. 155-156 and 169-170 (Oct. 2000).
Laird Technologies, "All Purpose Gaskets," dated at least as early as Mar. 21, 2001 and printed from http://www.instrumentspecialties.com/scripts/ cgiip.exe/WService=wsCatalog/pg66.r?webic., 2 pages.
Tecknit, A. Wire Mesh, "Custom Strips, Wire Mesh Over Elastomer Core," pp. A-3-A-4 (dated before the filing date of the present application).
Tecknit, B. Metal Fibers and Screens, "Duolastic™ Wire Screen Impregnated with Elastomer," pp. B-1-B-2 (dated before the filing date of the present application).
Tecknit, B. Metal Fibers and Screens, "Conmax® Nickel Fiber-Filled Silicone Elastomer," pp. B-7-B-8 (dated before the filing date of the present application).
Tecknit, C. Oriented Wires, "Elastomet® Oriented Wires in Solid Silicone Rubber," pp. C-1-C2 (dated before the filing date of the present application).
Tecknit, D. Conductive Elastomers, "Consil®-II, Molded Silver-Filled Silicone Elastomer," pp. D-11-D-12 (dated before the filing date of the present application).
Tecknit, H. Shielding Components, "EMI Connector Gaskets, EMI Flange Seals for Electrical Connectors," p. H-5 (dated before the filing date of the present application).
Electromagnetic Compatibility Handbook, "Connectors," pp. 246-247 (dated before the filing date of the present application).
Photograph of D-Shell Connectors, 1 page (dated before the filing date of the present application).
U.S. Appl. No. 10/161,023, filed May 31, 2002.
U.S. Appl. No. 09/881,464, filed Jun. 14, 2001.

* cited by examiner

*Primary Examiner*—Kamand Cuneo
(74) *Attorney, Agent, or Firm*—Dan Hu; Harden E. Stevens; John D. Cowart

(57) ABSTRACT

A supplemental shield is used to cover a radiation leakage path through a chassis of the system. The supplemental shield is attached to at least one surface in the system to cover the radiation leakage path. In one arrangement, the supplemental shield has an adhesive portion to attach the supplemental shield to the at least one surface.

16 Claims, 6 Drawing Sheets

PROVIDING SHIELDS FOR SYSTEMS

BACKGROUND

A computer system includes a number of components, including a central processing unit (CPU), memory, and peripheral devices. Examples of peripheral devices include storage media cards, video cards, modem cards, network cards, and other adapter cards. In high-performance computer systems, a large number of adapter cards can be installed in the system. In most cases, adapter cards are mounted to adapter card brackets, which in turn are attached to the main chassis of the computer system. To receive the adapter card brackets, openings are provided in the chassis. Such openings are typically provided in what is referred to as a "card cage portion" of the chassis. The card cage portion has multiple openings to receive multiple adapter cards. The adapter card brackets are attached to corresponding structures of the card cage portion.

One of the issues associated with the openings in the chassis is the likelihood of electromagnetic emissions. A primary concern of electromagnetic emissions is the potential for electromagnetic interference (EMI). To reduce radiated emissions, intimate electrical contact must be achieved between the adapter card bracket and the main chassis. To achieve such intimate electrical contact, some manufacturers of computer systems provide factory-installed radiation gaskets, particularly on servers and nodes designed for multiple CPUs and/or multiple adapter cards. A radiation gasket is formed of an electrically conductive material and is placed between the adapter card bracket and the chassis to enhance the electrical contact between the adapter card bracket and the chassis.

As computer technology has evolved, the speeds at which components in computer systems can operate has increased dramatically. Frequencies at which individual components can operate as well as the frequency of busses (which provide the interconnection between components of a computer system) can be relatively high. The higher the frequency, the greater the amount of noise generated by operation of the computer system. The high-frequency noise resulting from such operation results in increased electromagnetic emissions.

As computer system operating frequencies have increased, factory-installed gaskets often do not provide adequate protection against electromagnetic emissions from the chassis openings. If a computer system has a dense arrangement of adapter cards, an even greater amount of radiation leakage may result. In addition, computer systems must exhibit immunity from external electromagnetic emissions, such as an electrostatic discharge (ESD) near the adapter card cage. In many instances, the factory-installed gaskets do not provide adequate protection against ESD.

SUMMARY

In general, a mechanism is provided to reduce radiation emissions from a system and/or to increase immunity from external electromagnetic fields, such as ESD. For example, a method of reducing radiation emission from a system having a chassis includes attaching an electronic device assembly to the chassis at a mounting structure. A supplemental shield is mounted to at least one surface in the system to cover a radiation leakage path. In some examples, the supplemental shield has an adhesive portion to enable attachment of the supplemental shield to the at least one surface.

Other or alternative features will become apparent from the following description, from the drawings, and from the claims.

DETAILED DESCRIPTION

In the following description, numerous details are set forth to provide an understanding of the present invention. However, it will be understood by those skilled in the art that the present invention may be practiced without these details and that numerous variations or modifications from the described embodiments are possible.

Figure 1:
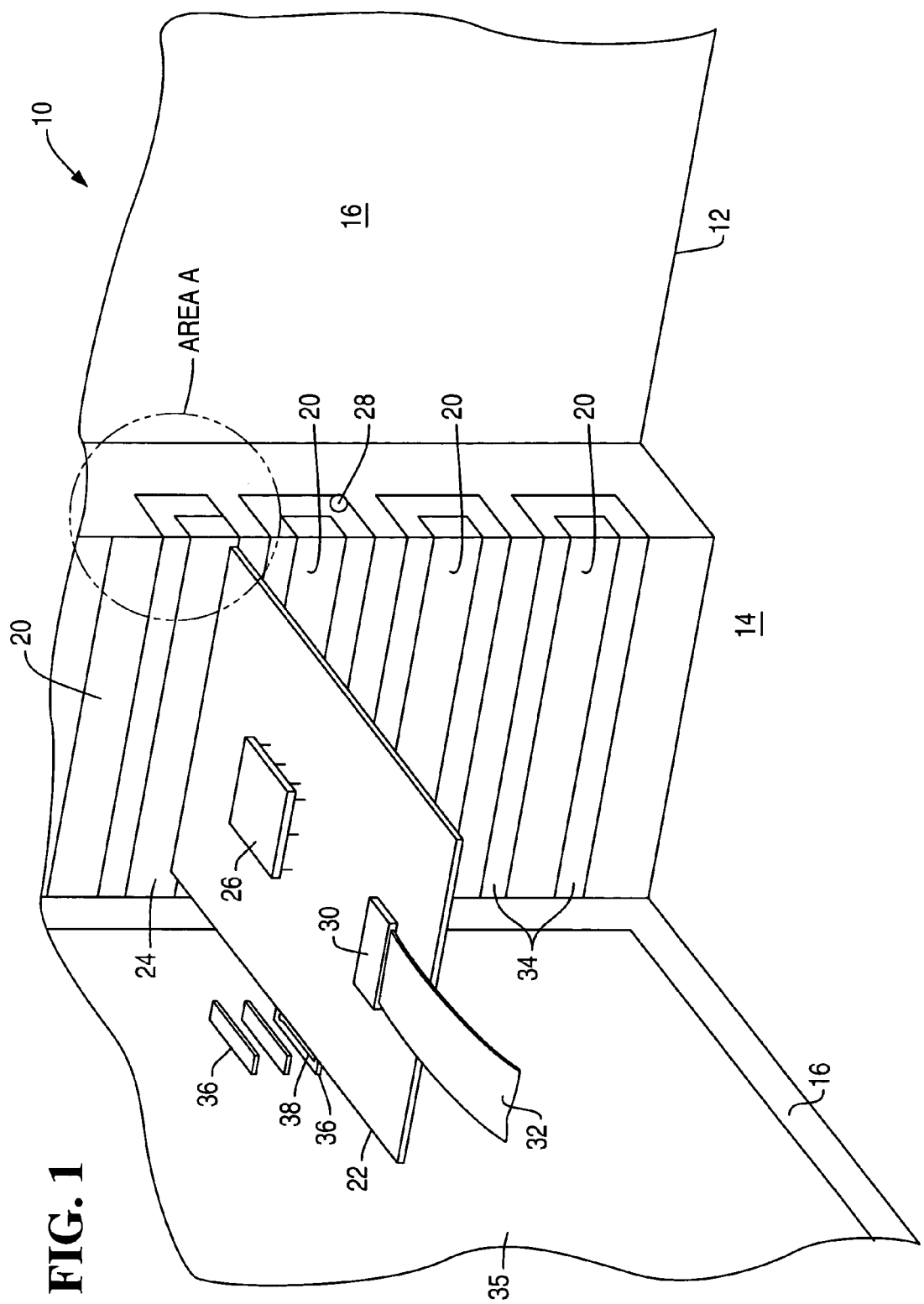
FIG. 1 illustrates a portion of a computer system that has an array of adapter card openings in the main chassis of a computer system.

FIG. 1 shows the inside of a main chassis 12 of a computer system 10. The main chassis 12 includes a lower surface 14 and side surfaces 16. An array of openings 20 are provided through one of the side surfaces 16 of the main chassis 12. In one arrangement, the array of openings is defined in a "card cage portion" of the chassis 12. The card cage portion is provided to receive adapter cards, which are examples of electronic devices that are part of the system 10. The openings 20 in the card cage portion are configured to receive adapter cards so that the adapter cards can be attached to the main chassis 12. For example, as shown in FIG. 1, an adapter card 22 is connected to an adapter card bracket 24. The adapter card bracket 24 is in turn mounted to the chassis 12 at one of the openings 20. Other adapter cards and attached adapter card brackets can similarly be attached to the chassis 12 at other openings 20.

Each adapter card bracket 24 is attached to the chassis 12 at a mounting structure 28 of the chassis. The adapter card bracket 24 is attached to the mounting structure 28 by use of attachment mechanisms such as screws, nut and bolt assemblies, rivets, and so forth.

The adapter card 22 includes a number of integrated circuit (IC) chips 26 and other devices. The adapter card 22 has an edge connector 38 for connection to a connector 36 of a main (mother) board 35. The main board typically includes a central processing unit (CPU), memory, busses, and other components. The main board 35 also includes multiple connectors 36 for receiving multiple adapter cards 22. Electrical signaling is communicated between the adapter card 22 and the main board 35 through the connectors 36, 38. Although not shown, primary input/output (I/O) connectors are also provided on the adapter card 22 for electrically connecting the adapter card 22 to an I/O device (e.g., Ethernet device, modem, etc.). Typically, the primary I/O connector is provided on the adapter card bracket 24. Optionally, the adapter card 22 includes another (I/O) connector 30 to which a cable 32 can be connected. The cable 32 connects the adapter card 22 to the main board 35 of the computer system.

The assembly of the adapter card 22 and adapter card bracket 24 is referred to as an "adapter card assembly." More generally, the assembly of any electronic device with its associated mounting mechanism is referred to as an "electronic device assembly."

During operation of the computer system, one of the concerns is the leakage of radiation through leakage paths that may exist through the openings 20. Even though the adapter card assembly is tightly attached to the chassis 12, radiation leakage paths can still exist such that electromagnetic emissions through the openings will occur. To reduce the likelihood of radiation emissions through such leakage paths, radiation gaskets 34 are mounted around the openings 20. Each gasket 34 is provided between the adapter card bracket 24 and the main chassis 12 to reduce radiated leakage into or out of the system.

The radiation gaskets 34 are typically pre-installed gaskets (such as installed at the factory or at some other manufacturing facility). Alternatively, such gaskets 34 may be installed by a user. The radiation gaskets 34 are formed of an electrically conductive material to enhance the electrical contact between the adapter card bracket 24 and the main chassis 12. Despite the presence of such radiation gaskets 34, radiation leakage may still occur at high-frequency operation.

To address the issue of electromagnetic emissions, supplemental shields are provided to cover radiation leakage paths in the system. Such supplemental shields are add-on shields that a user can add to a system to reduce radiation leakage. In some embodiments, the supplemental shields have adhesive portions to provide a convenient attachment mechanism. In other embodiments, instead of adhesive portions, supplemental shields are attached to surfaces within a system by other attachment mechanisms.

Figure 2:
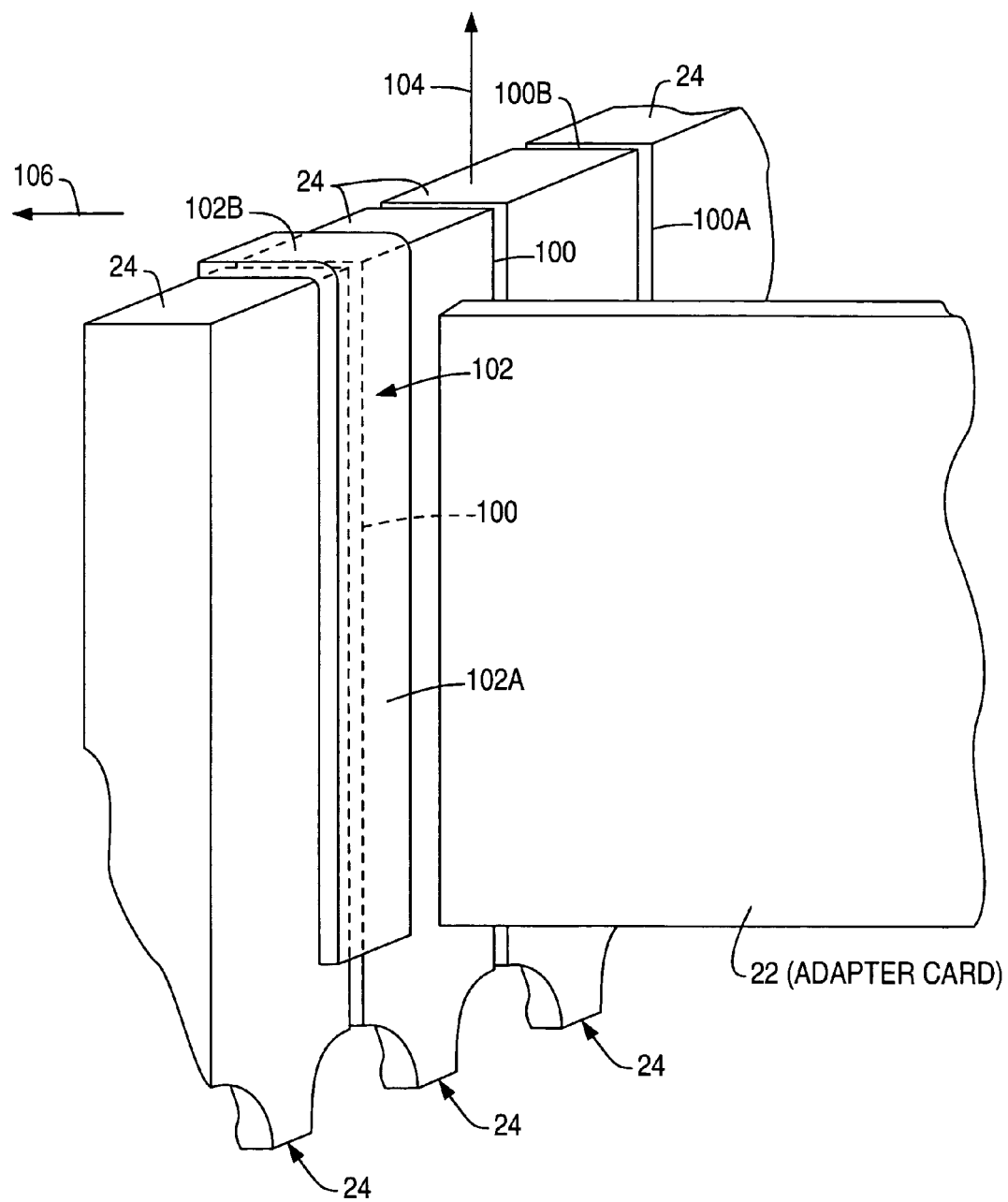
FIG. 2 illustrates an example arrangement of adapter card brackets received in such openings and attached to the main chassis, along with supplemental shields used to cover leakage paths in the main chassis.

A different perspective view of an array of adapter card assemblies mounted on the chassis 12 is illustrated in FIG. 2. For the sake of clarity, only one of the adapter brackets 24 is connected to an adapter card 22. The other adapter card brackets 24 may also be connected to corresponding adapter cards that are not shown. However, in some cases, blank card brackets may be used for openings 20 in the main chassis 12 in which adapter cards are not mounted.

As shown in FIG. 2, a space or gap 100 exists between successive adapter card brackets 24. This gap 100 is part of a leakage path through which radiation may leak. To prevent leakage of radiation through these gaps 100, a supplemental shield 102 is provided to cover each gap 100. According to some embodiments, one surface of the supplemental shield 102 has an adhesive layer that allows the supplemental shield 102 to be affixed to surfaces of the adapter card brackets 24 to cover the gaps 100. In other embodiments, each supplemental shield 102 has another type of attachment mechanism.

In the embodiment shown in FIG. 2, the supplemental shield 102 is a strip that extends a sufficient length to cover the gap that extends along a first direction 104 and a second direction 106, with the second direction 106 being generally perpendicular (or otherwise angled) with respect to the first direction 104. Thus, each gap 100 has two portions: a first portion 100A (which extends along direction 104) and a second portion 100B (which extends along the second direction 106). In other embodiments, the gap 100 can have further portions that extend along other directions. The exact orientation and shape of the gap 100 is dependent upon the relative positions and shapes of successive adapter card brackets 24.

To cover the gap 100 having multiple portions 100A and 100B, the supplemental shield strip 102 also has two portions: 102A and 102B. The portion 102A covers the gap portion 100A along the first direction 104, while the second supplemental shield portion 102B covers the gap portion 100B along the second direction 106. The shield 102 can be used to cover other radiation leakage paths in the system 10.

Although the supplemental shield is in the shape of a strip in the embodiment shown in FIG. 2, other embodiments can use supplemental shields having other shapes, such as rectangular shapes, circular shapes, oval shapes, triangular shapes, and so forth. A characteristic of the supplemental shield according to some embodiments is that it has an adhesive portion (or plural adhesive portions). Generally, such a supplemental shield is referred to as an "adhesive shield." An adhesive shield has at least one adhesive portion (e.g., at least one of its surfaces has an adhesive) that enables the shield to be attached to some surface (or surfaces) in the system 10 to enable the shield to cover radiation leakage paths in the main chassis of the computer system. The adhesive portion of the supplemental shield is formed of an electrically conductive material.

In other embodiments other types of attachment mechanisms are used to attach the supplemental shield to surface(s) in the chassis.

A benefit offered by using a supplemental shield is its convenience and flexibility. Also, because of the flexible nature of the supplemental shield, the user can manipulate the supplemental shield to ensure that any opening through which radiation leakage may flow is covered by the shield. A further benefit is that the supplemental shields are not pre-installed; instead, they can be added on by a user to the system on an as-needed basis. Thus, after adapter cards are mounted in the system, the supplemental shields can be added on by attaching them to surface(s) in the chassis.

Figure 3A:
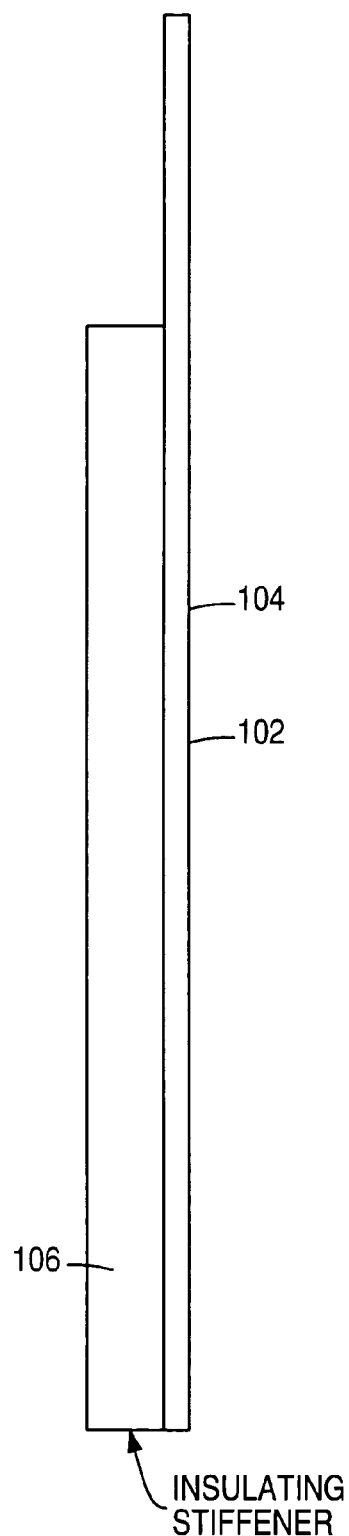
FIGS. 3A–3B are a side view and perspective view, respectively, of supplemental shields according to one embodiment of the invention.
Figure 3B:
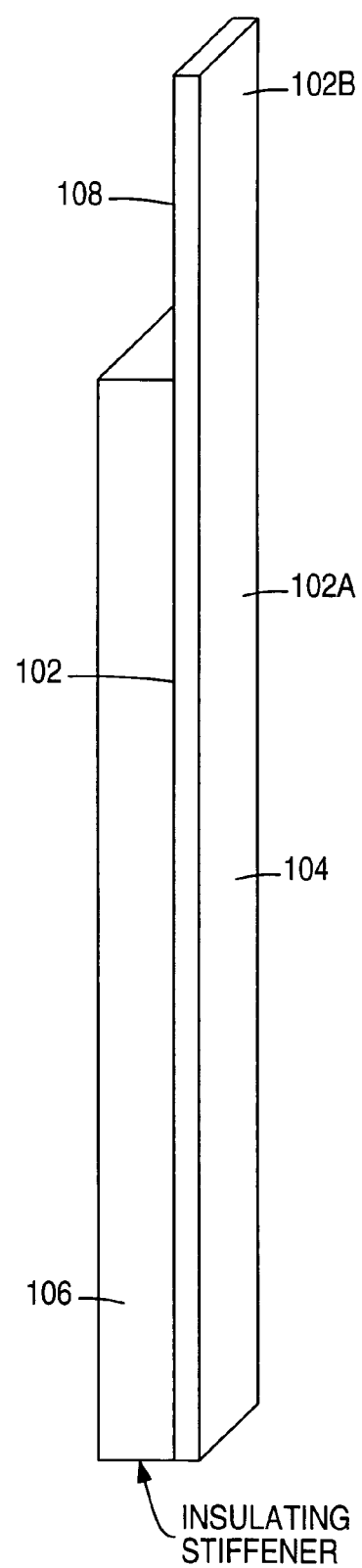

FIG. 3A shows a side view of an adhesive shield, while FIG. 3B shows a perspective view of the adhesive shield. In the embodiment shown in FIGS. 3A and 3B, the adhesive shield 102 is basically a tape or foil that is formed of an electrically conductive material, such as copper or some other metallic or non-metallic material that has the desired electrically conductive characteristics. A first surface 104 of the tape or foil 102 is provided with a layer of an electrically conductive adhesive, which can be a layer that is deposited or otherwise formed on or attached to the surface 104 of the foil. An electrically conductive adhesive is basically any type of adhesive that is filled with electrically conductive particles to provide the electrically conductive characteristic.

For ease of handling, according to one embodiment, a stiffener structure 106 is attached to the other surface 108 of the tape or foil 102. The stiffener 106 is formed of an insulating material. The role of the stiffener 106 is to provide a structure to carry the electrically conductive tape or foil 102 (which may be thin and thus difficult to handle by a user). The stiffener 106 does not extend the entire length of the electrically conductive tape or foil 102. The reduced length of the stiffener 106 defines the two portions 102A and 102B of the tape or foil 102. The upper portion 102B shown in FIGS. 3A–3B can be bent to fit over the gap portion 100B (FIG. 2) between adapter card brackets 24. Although the supplemental shield as shown in FIGS. 3A–3B includes a stiffener structure, other supplemental shields do not include the stiffener structure. Once the supplemental shield 102 is mounted, the stiffener structure can be removed. In other embodiments, the stiffener is not removed.

Figure 4:
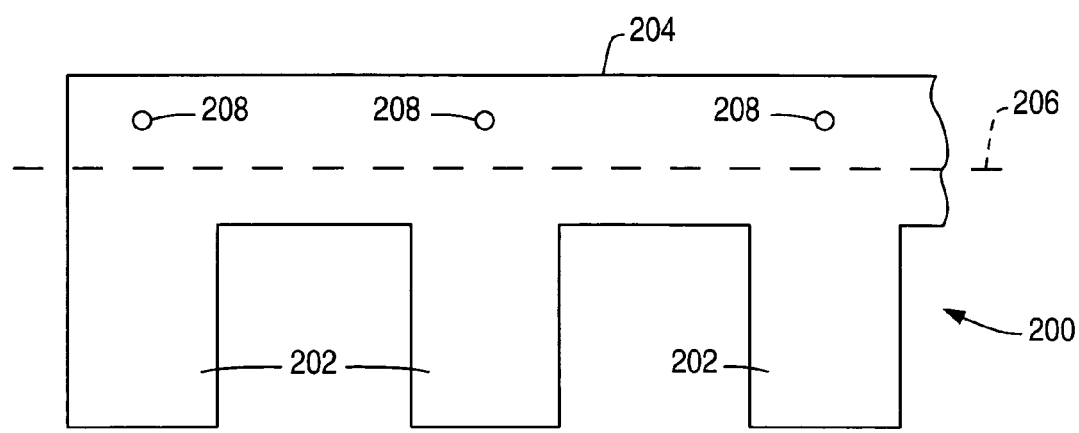
FIG. 4 illustrates a shield having multiple finger portions for covering multiple corresponding leakage paths.
Figure 6A:
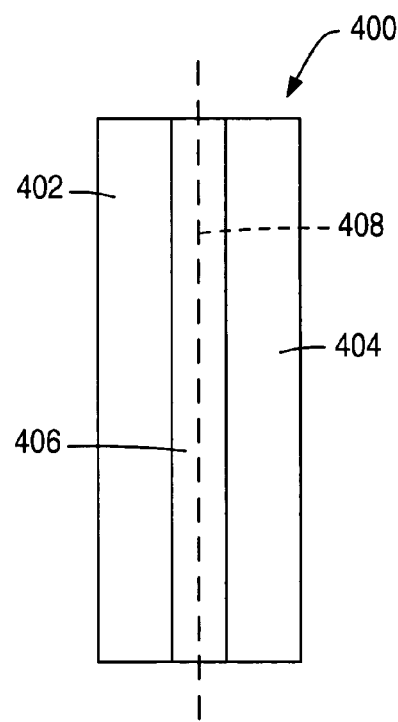
FIGS. 6A–6B illustrate a top view and a side view, respectively, of the shield useable in the arrangement of FIG. 7.
Figure 6B:
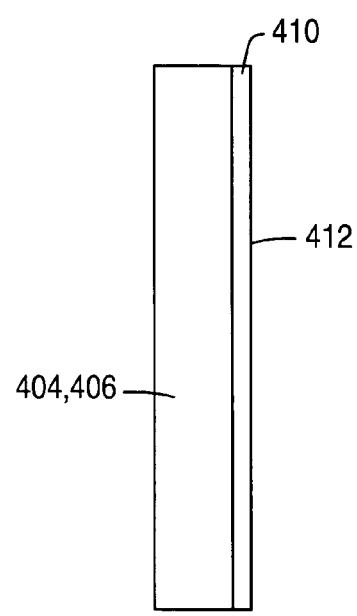

In the embodiment shown in FIGS. 2 and 3A–3B, the supplemental shields are arranged as strips. Thus, to cover multiple gaps 100 between successive brackets 24, multiple strips 102 are used. In a different embodiment, instead of using multiple strips, a single large piece of adhesive shield can be used instead. Such a single large piece of adhesive shield is shown as a "template" 200 in FIG. 4. The shield template 200 has multiple fingers 202 of sufficient width to cover respective gaps 100 between brackets 24. In one embodiment, the width of each finger 202 is basically the same as the width of the strip 102 shown in FIG. 2.

Each finger 202 is integrally connected to a connector portion 204 of the shield template 200. This connector portion 204 can be bent at a dashed line indicated at 206 with respect to the fingers 202. The connector portion 204 contains holes 208 through which an attachment element can be passed to connect the shield 200 to a structure (e.g., chassis, adapter card brackets, etc.) in the system. One example, of an attachment element is a screw.

Figure 5:
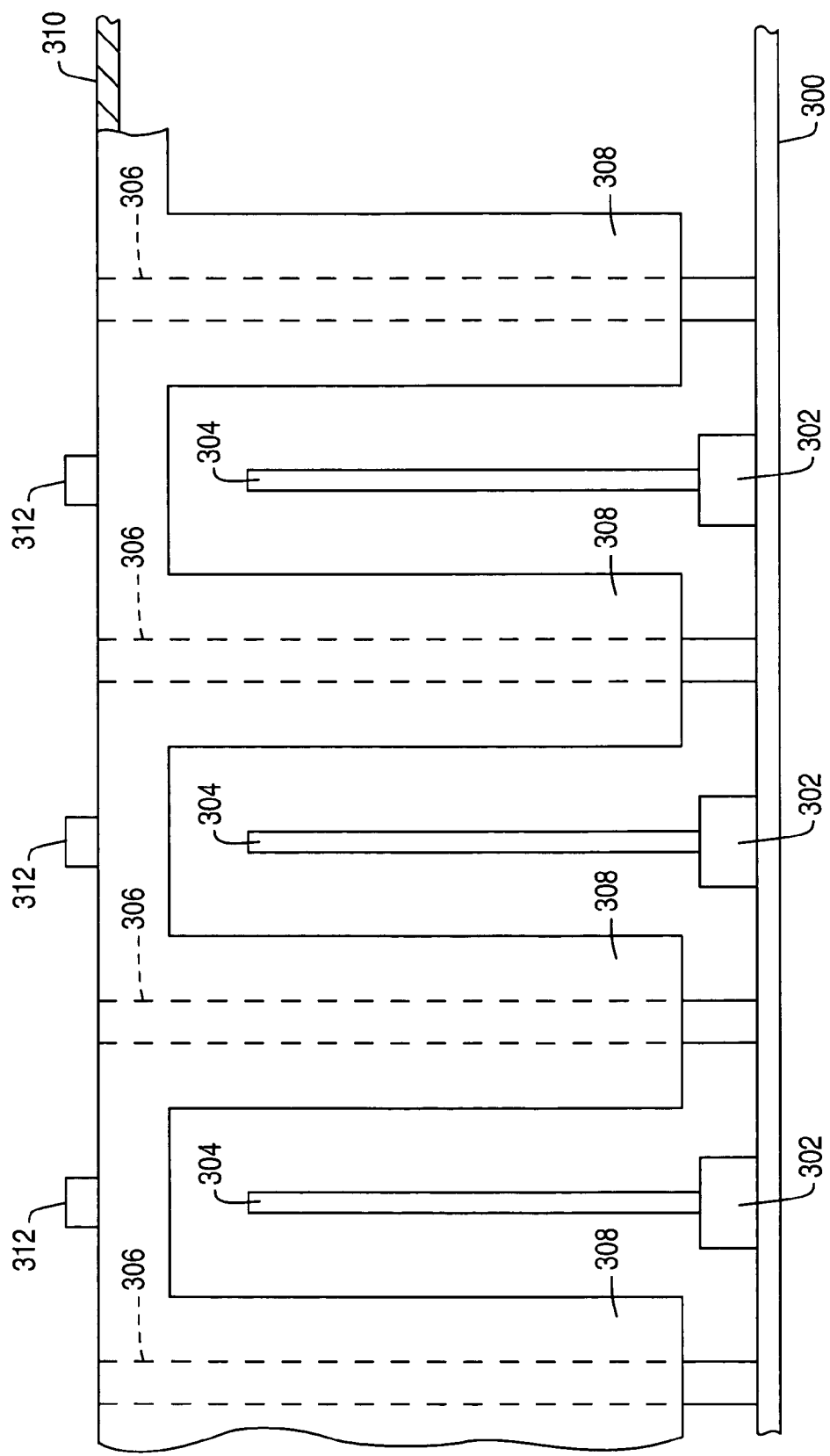
FIG. 5 illustrates the shield of FIG. 4 installed in a system.

FIG. 5 shows the shield 200 provided inside a chassis of a computer system. The system includes a main board or a motherboard 300 having a number of sockets 302. Adapter cards 304 are inserted into respective sockets 302 of the motherboard 300. As described above, such adapter cards 304 are mounted to respective adapter card brackets 306, with the adapter card brackets 306 mounted to corresponding structures of the main chassis of the computer system. Gaps 308 are present between successive brackets 306.

The shield template 200 is mounted in the chassis to cover the gaps 308. The connector portion 204 is bent to engage a structure 310 inside the system. Screws 312 are then fitted through the holes 208 (FIG. 4) to affix the shield template 200 to the chassis. A portion of the shield template 200 can be cut away to adjust the length of the shield template 200 to fit within a space within the system.

FIGS. 6, 7, and 8A–8B illustrate another embodiment of a supplemental shield. As shown in FIG. 6A, in this embodiment, the shield 400, which is basically a strip, is bendable along a longitudinal axis 408 of the strip 400. The strip 400 has a first stiffener structure 402 and a second stiffener structure 404, both extending along the longitudinal axis 408 of the shield 400. A space 406 is provided between the stiffener structures 402 and 404 so that the strip is bendable at the longitudinal axis 408. FIG. 6B shows a side view of the shield 400, which has the stiffener 404/406 and a layer 410 of an electrically conductive material. Also, an adhesive layer 412 is provided on the surface of the layer 410 facing away from the stiffener structure 404/406.

Figure 7:
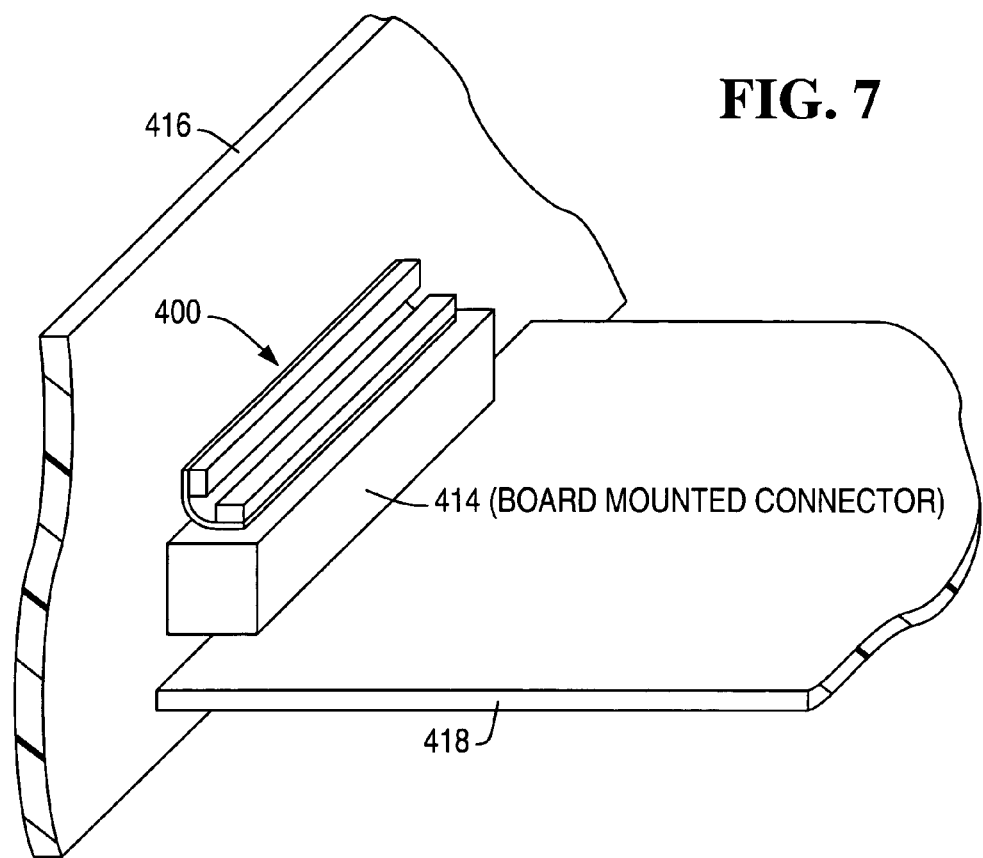
FIG. 7 is a perspective view of an arrangement of an adapter card assembly mounted to a chassis of a system, and a shield according to another embodiment attached to surfaces in the system and covering a radiation leakage path between a connector of the adapter card assembly and the chassis.
Figure 8:
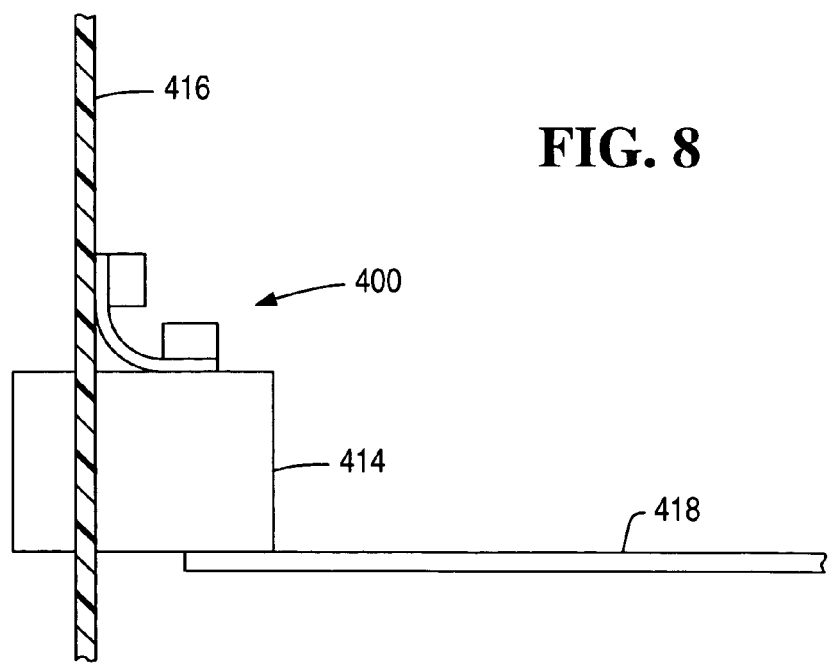
FIG. 8 is a side view of the arrangement of FIG. 7.

FIG. 7 shows application of the shield 400 to cover a radiation leakage path at a boundary between a board-mounted connector 414 and a chassis 416 of a system. FIG. 8 shows a side view of the arrangement of FIG. 7. As shown, the shield 400 is bent at the longitudinal axis 408 such that one portion of the shield 400 is affixed to a surface of the board-mounted connector 414, while the other portion of the shield 400 is affixed to the chassis 416. The board-mounted connector 414 is attached to a printed circuit board 418, in the illustrated embodiment.

While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A method of reducing radiation emission from a system having a chassis, comprising:

attaching an electronic device assembly to the chassis, leaving a path for radiation leakage where the assembly attaches to the chassis;

providing a shield comprising an electrically conductive foil having an electrically conductive adhesive portion attached to a first side of the foil and a removable stiffener structure attached to a second side of the foil; and attaching, using the adhesive portion, the shield to at least one surface inside the system to cover the radiation leakage path through the chassis.

2. The method of claim 1, wherein the electronic device assembly comprises an electronic device and a bracket to which the electronic device is mounted, and wherein attaching the electronic device assembly to the chassis comprises attaching the bracket to the chassis.

3. The method of claim 2, wherein the electronic device assembly comprises a first electronic device assembly, the method further comprising attaching a second electronic device assembly having an electronic device and a bracket to the chassis.

4. The method of claim 3, wherein attaching the first and second electronic device assemblies comprises attaching the first and second electronic device assemblies next to each other; and wherein attaching the shield to cover the radiation leakage path comprises attaching the shield to cover a space between the brackets of the first and second electronic device assemblies.

5. The method of claim 1, further comprising providing a radiation gasket between the electronic device assembly and the chassis.

6. A system comprising:

a chassis;

an electronic device assembly mounted to the chassis in a manner that leaves a radiation leakage path through the chassis where the assembly is mounted;

a shield comprising an electrically conductive foil having an electrically conductive adhesive portion attached to a first side of the foil and a removable stiffener structure attached to a second side of the foil; and a surface in the system, wherein the shield is attached to the surface by the adhesive portion to cover the radiation leakage path.

7. The system of claim 6, wherein the shield has plural finger portions, the plural finger portions to cover respective radiation leakage paths in the system.

8. The system of claim 6, wherein the electronic device assembly comprises an adapter card and a bracket attached to the adapter card.

9. A system comprising:

a chassis;

an electronic assembly mounted to the chassis, where the chassis includes a path for radiation leakage where the assembly is mounted;

a shielding structure comprising an electrically conductive foil having an electrically conductive adhesive portion attached to a first side of the foil and a removable stiffener structure attached to a second side of the foil; and where the shielding structure is mounted to the chassis after the electronic assembly is in place to cover the radiation leakage path.

10. The system of claim 9, further comprising a radiation gasket placed in a manner to enhance electrical contact between the electronic assembly and the chassis.

11. The system of claim 10, where the radiation gasket and the shielding structure are separate pieces.

12. A system comprising:
a chassis,
multiple electronic assemblies mounted to the chassis, where the chassis includes multiple paths for radiation leakage at locations where the electronic assemblies mount to the chassis, and
a shielding structure comprising an electrically conductive foil having an electrically conductive adhesive portion attached to a first side of the foil and a removable stiffener structure attached to a second side of the foil; and
where the shielding structure is mounted to the chassis and has multiple shielding elements, each of which is positioned to cover at least one of the radiation leakage paths and is attached using the adhesive portion.

13. The system of claim 12, where the assemblies mount adjacent to each other and the shielding elements each are positioned between adjacent assemblies.

14. The system of claim 12, where the electronic assemblies include adapter cards and card brackets, the radiation leakage paths are formed by card slots filled by the assemblies, and the shielding structure includes elements adapted to fit among the assemblies to cover the leakage paths formed by the card slots.

15. A shielding structure for use in preventing radiation emission from leaking through a chassis along a path formed where an electronic assembly mounts to the chassis, the structure comprising:

a shielding element shaped to cover the leakage path formed where the electronic assembly mounts to the chassis, where the shielding element includes an electrically conductive foil having an electrically conductive adhesive portion attached to a first side of the foil; and a removable mounting element attached to a second side of the foil adapted to mount the shielding structure to the chassis after the electronic assembly is in place.

16. The structure of claim 15, where the structure includes multiple shielding elements, each positioned to cover at least one of multiple leakage paths formed between the chassis and multiple electronic assemblies mounted to the chassis.

* * * * *